INVENTORS
Robert M. Handy
Joseph E. Johnson
BY A. Samuel Oddi

July 4, 1967 R. M. HANDY ET AL 3,329,823

SOLID STATE THIN FILM PHOTOSENSITIVE DEVICE
WITH TUNNEL BARRIERS

Filed Dec. 12, 1963 3 Sheets-Sheet 3

United States Patent Office 3,329,823
Patented July 4, 1967

3,329,823
SOLID STATE THIN FILM PHOTOSENSITIVE DEVICE WITH TUNNEL BARRIERS

Robert M. Handy, Export, and Joseph E. Johnson, Pittsburgh, Pa., assignors to Westinghouse Electric Corporation, Pittsburgh, Pa., a corporation of Pennsylvania
Filed Dec. 12, 1963, Ser. No. 330,063
6 Claims. (Cl. 250—211)

This invention relates to a radiation sensitive device, and more particularly to a solid state device incorporating amplification.

There are several photosensitive devices known to the industry including several solid state devices. It is found that most of the present devices known in the industry are severely limited as far as spectral response, gain, sensitivity and other reasons. A device which overcomes many of the above-mentioned problems is disclosed in copending application Ser. No. 330,053, filed Dec. 12, 1963, by Dr. Peter Brody and assigned to the same assignee as the present invention. Several improvements over the Brody application as well as other improved devices are presented herein.

It is, accordingly, an object of this invention to provide an improved solid state photosensitive device.

It is still another object of this invention to provide an improved solid state device sensitive to radiations of long wavelength.

It is still another object of this invention to provide an improved solid state photosensitive device over a large spectral range.

It is still another object of this invention to provide an improved solid state device providing large area structures and amplification.

Briefly, the present invention accomplishes the above-cited objects by providing a metallic electrode which is sensitive to radiations to generate photoelectrons therein and providing a potential barrier adjacent the opposite side of the metallic layer to provide energy selection of the electrons within the metallic layer. In addition, amplification of the energy selected electrons may be obtained by utilization of semiconducting materials.

Further objects and advantages of the invention will become apparent as the following description proceeds and features of novelty which characterize the invention will be pointed out in particularity in the claims annexed to and forming a part of this specification.

For a better understanding of the invention, reference may be had to the accompanying drawings, in which.

Figure 1:
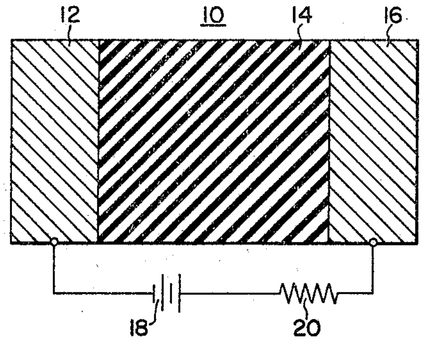
FIGURE 1 illustrates one embodiment of this invention which may be used as a photocell.
Figure 2:
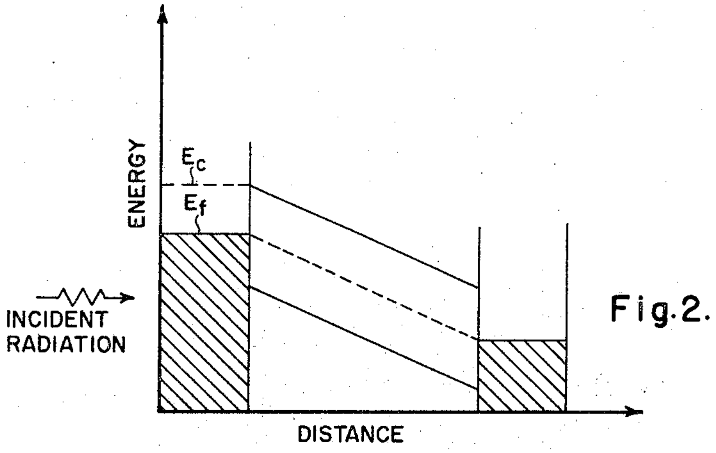
FIG. 2 is an energy level diagram representing conditions within the device illustrated in FIG. 1.

Referring to FIGS. 1 and 2, there is illustrated a solid state photocell 10. The operation of this device depends on the utilization of the long ranges of low energy electrons in metals and an energy selection characteristic of a tunneling barrier.

The photocell 10 illustrated in FIG. 1 includes a thin metallic layer 12, which may be referred to as an emitter, that is separated from a second metallic electrode 16, which may be referred to as a collector, by a thin insulating tunnel barrier region 14.

The device may be fabricated by depositing a thin metal layer on a support member which is transmissive to the radiation to which the device will be submitted. A suitable metallic layer is aluminum and this may be evaporated onto the support layer to a thickness of about 50 to 500 angstroms. The normal practice here would be to evaporate the aluminum in a vacuum and then permit oxygen to enter into the system which will convert the exposed surface of the aluminum to aluminum oxide of a thickness of about 20 to 50 angstroms. The collector electrode 16 may then be evaporated onto the aluminum oxide layer 14. The collector electrode may be of any suitable conductive material such as gold, platinum or silver. The emitter electrode 12 should be thick enough to provide near total absorption of the radiation present on the film, but thin enough so that excited photoelectrons within the layer are capable of reaching the interface between the emitter electrode 12 and the insulating layer 14 without appreciable loss of energy. For example, a one electron-volt electron in aluminum will have a range of about 1000 angstroms.

The tunnel barrier formed at the interface between the emitter 12 and the insulator layer 14 provides means for collecting the photo excited electrons within the emitter electrode 12 in preference to the electrons present in the metal at energies $E_f \pm kT$, where $E_f$ is the Fermi energy level, T is the absolute temperature and $k$ is Boltzmann's constant. This is so that the radiation can be detected by an increase in current through the device. It is found that the transmission probability of an excited electron through the potential barrier is a function of the energy of the electron over the difference in energy between the Fermi level $E_f$ of the emitter layer 12 and the energy level $E_c$ of the conduction band of the insulating layer 14. By selecting the height or the difference in energy ($E_c - E_f$) between the conduction band of the insulator and the Fermi level of the metal, a significant current through the cell will be that carried only by the photo excited electrons. Thus, photo excited electrons which reach the barrier by virtue of their long range at low energies have a far greater probability of tunneling through and reaching the collector than the normal conduction electrons of the metal.

By providing a voltage source, such as a battery 18 with a resistor 20 in series connected across the emitter 12 and the collector 16, a signal may be derived representative of the photoelectrons excited when radiation is directed onto the emitter layer 12.

This type of device is, in effect, a solid state analog of the well known vacuum photocell. In addition, the structure provides obvious structural advantages over a conventional vacuum photocell and provides a very compact device. It also provides promise for use in the longer wavelength regions, namely, the infrared, where ordinary photocells are no longer useful. In contrast to the vacuum photocell, the tunnel barrier height can be adjusted down to zero so that the long wavelength limit is not fixed by the availability of low vacuum work function surfaces. The tunnel barrier height can be adjusted simply by the voltage impressed across the layer by the battery 18 or by selection of the materials utilized. The only long wavelength limitation on the device is determined by the tolerable dark current, that is, the current flow when no radiation is applied to the device. At the present state of development of simple tunnel structures, barrier heights of less than one-half electron volts are readily attainable, which would correspond to a wavelength of about 2.5 microns.

Another feature of the structure is that the metal film and tunnel barrier are effectively insensitive to the temperature and should offer stable operation at least over the range of 0 to 400° K. In addition, the noise in the device will stem primarily from the $k$T fluctuations in electron energies, which in this temperature range is less than 0.03 electron volt.

The insulating layer is normally an oxide layer of the metal and may be an anodically or thermally grown oxide layer which may be from 10 to 200 angstroms in thickness.

Figure 3:
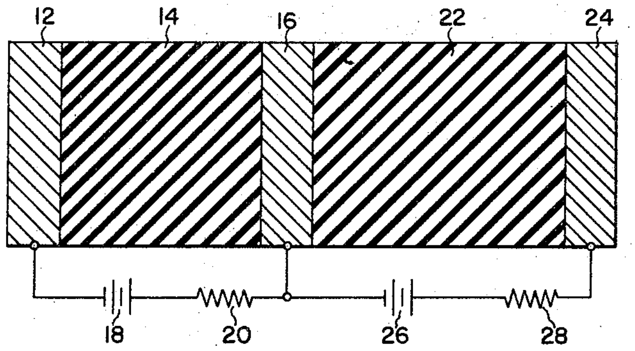
FIG. 3 illustrates a modification of the device shown in FIG. 1 to provide amplification of the signal.
Figure 4:
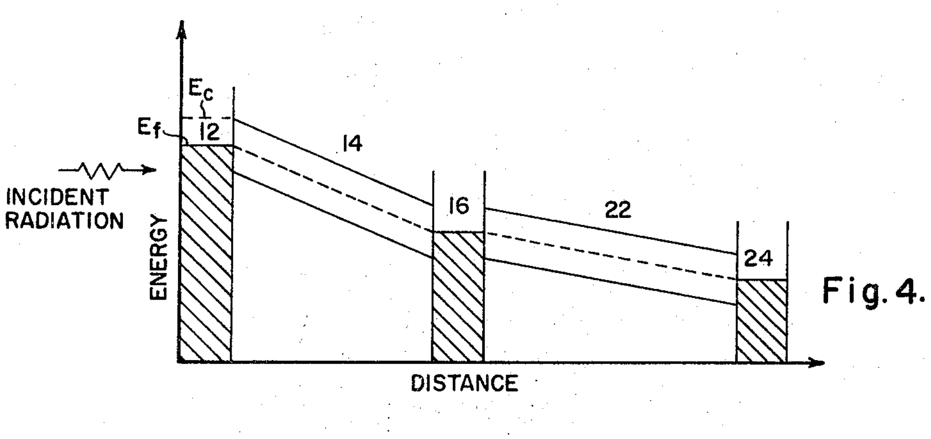
FIG. 4 is an energy level diagram representing conditions arising in the embodiment shown in FIG. 3.

In FIGS. 3 and 4, there is illustrated a modification of the device shown in FIGS. 1 and 2 to obtain a triode structure which provides internal power and voltage gain. The layers 12, 14 and 16 may again be formed in a similar manner as described with respect to FIG. 1. An insulating layer 22 of a thickness of about 20 to 500 angstroms is deposited or formed on the conductive layer 16. It should be noted here that the thickness of the conductive layer 16 is critical in this embodiment in that it should be of a minimum thickness to provide lateral conduction and allow penetration of the electrons that have tunneled across the preceding structure. The electrons will then be collected by a third metallic layer 24, which may be referred to as the collector electrode. The collector electrode 24 may be of any suitable electrically conductive material. As indicated in the drawing, an additional voltage source 26 and an output resistor 28 are connected in series between the conductive layer 16 and the conductive layer 24. The power and voltage gain in the device results from designing the insulator layer 22 to have a substantially greater operating resistance than the insulator layer 14. This may be accomplished by making the layer 22 thicker, or by the selection of materials. Since the electron flow through the layer 22 is substantially the same as through the layer 14, a voltage and power gain can result because of the higher operating resistance of the insulating layer 22.

Figure 5:
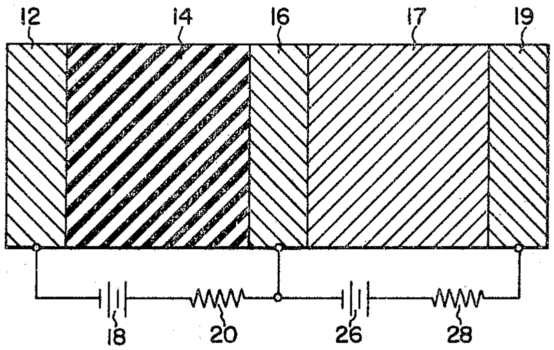
FIG. 5 illustrates a modification of the device shown in FIG. 1 so as to provide amplification of the detected signal.
Figure 6:
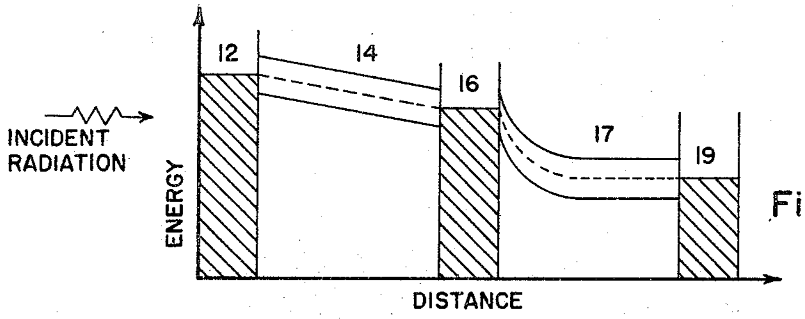
FIG. 6 is an energy level diagram representing the conditions arising in the embodiment shown in FIG. 5.

In FIGS. 5 and 6, there is illustrated another modification of the device shown in FIG. 1 in which power amplification is obtained by providing a semiconductor structure on the surface of the metallic layer 16. The semiconductive material is an n-type semiconductor. This may be accomplished by depositing on layer 16 a semiconducting layer 17 so that a potential barrier of the desired height is created at the juncture of layer 16 and the semiconducting layer 17. Again, it should be noted that the thickness of layer 16 is critical in this embodiment in that it should be of minimum thickness to provide lateral conduction and allow penetration of the electrons that have tunneled across the structure 12, 14, 16. The photo excited electrons will then pass over the potential barrier at the contact between the metal 16 and the semiconductor 17 and be collected by a metallic electrode 19 deposited on the semiconductor. The mettllic layers 19 and 16 may be of any suitable electrically conducting material such that when in contact with the semiconductor layer 17 and biased as shown in FIGS. 5 and 6, a blocking potential barrier exists between the metallic layer 16 and the semiconductive layer 17 and a non-blocking region exists between the semiconductive layer 17 and the collector layer 19.

The gain in the device of FIGS. 5 and 6 results by selecting the semiconductive layer 17 to have a substantially greater operating resistance than the insulator layer 14. The functioning of the device is then similar to that of FIGS. 3 and 4.

Figure 7:
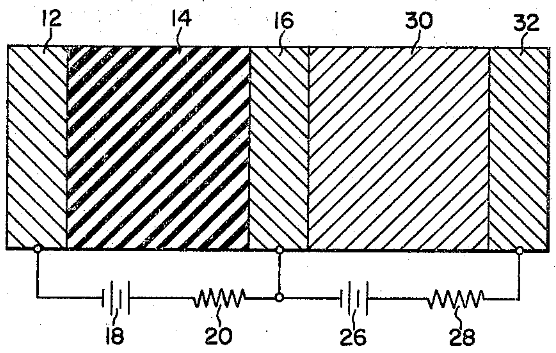
FIG. 7 is another modification of the device illustrated in FIG. 1 for providing current amplification of the signal derived.
Figure 8:
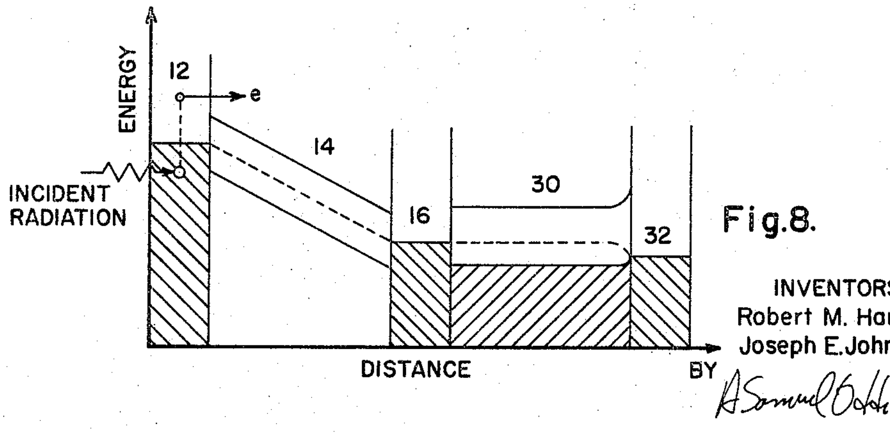
FIG. 8 is an energy level diagram representing the conditions arising in the embodiment shown in FIG. 7.

Referring now to FIGS. 7 and 8, there is illustrated another modification of the device shown in FIG. 1. This device is a solid state photocell based on the utilization of long ranges of low energy excited electrons in metals and the energy selection character of the tunnel barrier between two metallic layers. The device in FIG. 7 is modified from that in FIG. 1 and incorporates a p-type semiconductor region within the device to provide internal current gain. The structure of this device would again include an aluminum layer 12 and an aluminum oxide layer 14 and an aluminum layer 16. The semiconductor which may be evaporated onto the layer 16 could be of a suitable material such as cadmium telluride to form a layer 30. The thickness of this layer should be about 1 to 10 microns, and a metallic layer 32 is evaporated onto the semiconductor layer 30 to provide the electrical contact to the layer.

The devices described previously herein suffer from a limitation that their collection efficiency will be low and they are inherently restricted to a gain of less than unity with respect to current. This limitation can be overcome by the device shown in FIGS. 7 and 8 and is accomplished by adding another section to the device consisting of a p-type conducting region 30 and its metal electrode 32.

In the operation of the device, the input radiation will again excite electrons within the layer 12 which will in turn pass through the tunnel barrier at the interface between the layers 12 and 14. By virtue of the long range and favorable tunneling probability within this layer, the photoelectrons will be swept into the layer 16. The layer 16 must be thin to take advantage of the long range of the low energy exited electrons. This will provide an appreciable fraction of the incident photoelectrons penetrating into the conduction band of the semiconductor layer 30. The voltage applied by the voltage source 18 must be sufficient to permit the hot tunnel electrons to surmount the potential discontinuity associated with the neutral contact at the base layer 16 and semiconductor layer 30 interface. The hot electrons penetrating into the conduction band of the semiconductive layer 30 will be trapped and then eventually recombined. The semiconductor material must be of the type in which there are controlled trapping levels. For each trapped electron, a hole will enter into the semiconductive layer from the injecting contact at the interface between the semiconductive layer 30 and the layer 32. The hole is injected into the semiconductor layer to neutralize the space charge in the semiconductive layer 30. These holes will drift across the semiconductor layer 30 under the applied field from voltage source 26 with a transit time $T_t$ and be extracted at the neutral interface between the metal layer 16 and the semiconductive layer 30 contact. If the trap recombination time $T_r$ exceeds the transit time $T_t$, then another hole must be injected to maintain neutrality. In this manner, the device will provide current gain. The gain of the semiconductor is given by the ratio of these characteristic times, that is $$g=\frac{T_r}{T_t}$$

This gain can become very large and conceivably can more than compensate for the low electron transfer ratios which are presently observed in tunneling devices utilizing metal insulator films. The inclusion of the current gain within the device will materially enhance the sensitivity and long wavelength threshold of the simple device described with regard to FIG. 1. The response time of the device should be adequate for modulation frequencies of several kilocycles.

Figure 9:
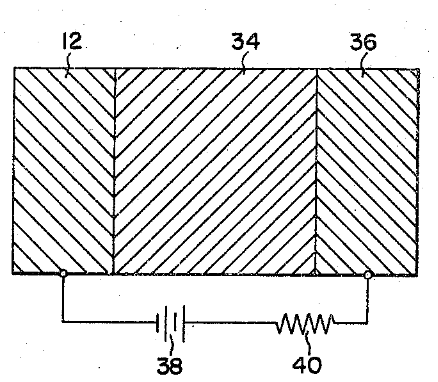
FIG. 9 is a modification of the device illustrated in FIG. 7.
Figure 10:
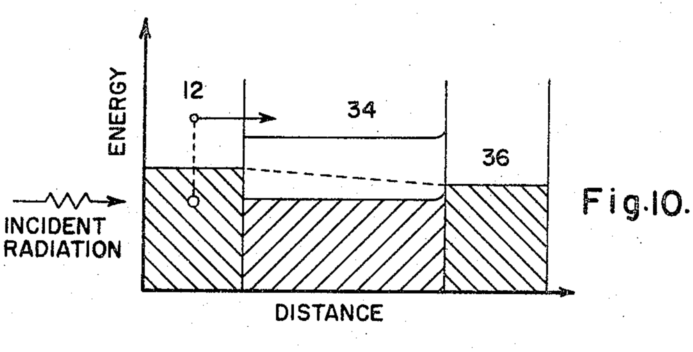
FIG. 10 is an energy level diagram representing the conditions arising in the embodiment illustrated in FIG. 9.

Referring now to FIGS. 9 and 10, there is shown a modification of the device shown in FIG. 7 in which the photosensitive metal electrode 12 is positioned in intimate contact with a semiconductor layer 34 of p-type semiconductivity. The electrode 12 should be thick enough to provide near total absorption of the radiation, but yet thinner than the range for the excited electrons in order that a significant number of the excited electrons can reach the interface between the metal layer 12 and the semiconductor layer 34. The photoelectrons which are exited to one electron volt above the Fermi level of the emitter electrode 12 will substantially all travel to the interface between the layers 12 and 34 and will have adequate energy to surmount the potential discontinuity between the layers 12 and 34 and enter the conduction band of the semiconductor. The electrons on entering the semiconductor layer 34 will be trapped and then eventually recombined with characteristic recombination time $T_r$. For each trapped electron, however, a hole must be drawn in from the injecting contact between the semiconductor layer 34 and a metallic layer 36 in order to neutralize the space charge presented by the trapped electron. This hole injected from the layer 36 will be swept across the semiconductor layer 34 with a transit time $T_t$ depending upon its mobility and the thickness of the semiconductive layer. If the recombination time $T_r$ exceeds the transit time $T_t$, then the semiconductor will exhibit a current gain as explained with regard to FIGS. 7 and 8. Thus, for every photo excited electron reaching the semiconductor region, it is possible to obtain on the order of $10^4$ electrons flowing through the external circuit including battery 38 and resistor 40. The output of the photocell could be obtained across the resistor 40.

The spectral response of the cell described in FIGS. 9 and 10 will be determined by the spectral absorption characteristic of the emitter layer 12, the potential step at the layer 12 and layer 34 interface and the variation of the excited electron range with initial energy. For example, with a 1 volt potential step at the interface between the layers 12 and 34 an estimate of the response indicates a broad peak in the visible region. At long wavelengths few electrons will have sufficient energy to surmount the potential step between the layers 12 and 34 and hence give cut-off in the vicinity of 1.2 microns for a 1-volt step. At short wavelengths fewer electrons are excited, per unit energy interval, and the range of the high energy electron drops off very rapidly with increasing energy predicting a short wavelength cut-off in the blue or near ultraviolet.

Although the present invention has been described with a certain degree of particularity, it should be understood that the present disclosure has been made only by way of example and numerous changes in the details of fabrication materials used and the combination arrangements of elements may be resorted to without departing from the scope and spirit of the present invention.

We claim as our invention:

1. A thin film photocell operative with incident radiations comprising, a first layer comprising an electrically conducting material to receive radiations said first layer having a thickness such that substantially all radiations received by said first layer are absorbed thereby and thin enough that a substantial number of photo excited electrons pass through said first layer, a second layer comprising an insulating material disposed contiguous said first layer to form a first metal insulator interface therebetween, said second layer being thin enough to permit tunneling of photo excited electrons therethrough, a third layer comprising an electrically conducting material disposed contiguous to said first insulating layer and being thin enough to permit electrons from said second layer to pass therethrough, a fourth layer comprising an electrically insulating material disposed contiguous to said third layer to form a second metal insulator interface therebetween, said second insulating layer having an operating resistance greater than said first insulating layer to give amplification within said photocell, and a fifth layer disposed adjacent said fourth layer to collect electrons provided thereto from said fourth layer, and biasing means operatively connected across said second and fourth layers to form a tunnel barrier at said first metal insulator interface, said tunnel barrier being adjustable so that radiations of predetermined wavelengths may be sensed by said photocell, and to provide an accelerating potential across said second insulating layer to collect electrons provided thereto.

2. A thin film photocell operative with incident radiations comprising, an emitting layer comprising an electrically conducting material having a resistance greater than zero to receive radiations, said emitting layer having a thickness such that substantially all radiations received by said emitting layer are absorbed thereby and thin enough that a substantial number of photo excited electrons pass therethrough; a first insulating layer disposed contiguous said emitting layer to form a metal insulator interface therebetween, said first insulating layer being thin enough to permit tunneling of photo excited electrons from said emitting layer therethrough, a contact layer comprising an electrically conducting material having a resistance greater than zero disposed contiguous to said first insulating layer and being thin enough to permit electrons from said first insulating layer to pass therethrough, a second insulating layer disposed contiguous to said contact layer to form a second metal insulator interface therebetween, said second insulating layer having an operating resistance greater than said first insulating layer to give amplification within said photocell, and a collector layer disposed contiguous to said second insulating layer to collect electrons provided from said second insulating layer, first biasing means operatively connected across said first insulating layer to form a tunnel barrier at said first metal insulator interface, said tunnel barrier being adjustable by said first biasing means so that radiations of predetermined wavelengths may be sensed by said photocell, and second biasing means operatively connected across said second insulating layer to accelerate electrons through said second insulating layer to said collecting layer.

3. A thin film photocell operative with incident radiations comprising, a first layer comprising an electrically conductive material to receive radiation, said first layer having a thickness such that substantially all radiations received by said first layer are absorbed thereby and thin enough that a substantial number of photo excited electrons pass through said first layer, a second layer comprising an insulating material disposed contiguous said first layer to form a metal insulator interface therebetween, said insulating layer being thin enough to permit tunneling of photo excited electrons therethrough, a third layer comprising an electrically conducting material disposed contiguous to said second layer, a fourth layer comprising a semiconductive material disposed contiguous to said third layer and establishing a predetermined potential barrier at the metal semiconductor interface with said third layer, said fourth layer having an operating resistance greater than said first insulating layer to give amplification of photo excited electron current, and a fifth layer comprising an electrically conductive material disposed contiguous to said fourth layer to collect electrons provided from said fourth layer, first biasing means operatively connected across said second layer to form a tunnel barrier at said metal insulator interface, said tunnel barrier being adjustable so that radiations of predetermined wavelengths may be sensed by said photocell, and second biasing means operatively connected across said fourth layer to accelerate electrons penetrating said second conducting layer over said potential barrier at said metal semiconductor interface through said semiconductive layer to be collected by said fifth layer.

4. A thin film photocell operative with incident radiations comprising, an emitting layer comprising an electrically conductive material having a resistance greater than zero to receive radiations, said emitting layer having a thickness such that substantially all radiations received are absorbed thereby and thin enough that a substantial number of photo excited electrons pass therethrough, an insulating layer disposed contiguous to said emitting layer to form a metal insulator interface therebetween, said insulating layer being thin enough to permit tunneling of photo excited electrons from said emitting layer therethrough, a contact layer comprising an electrically conducting material having a resistance greater than zero disposed contiguous to said insulating layer and being of such a thickness to allow lateral conduction and penetration of electrodes provided from said insulating layer, a semiconductive layer comprising a semiconductive material disposed contiguous to said contact layer, said semiconductor layer having an operating resistance greater than said first insulating layer to give amplification of photo excited electron current, and a collecting layer comprising an electrically conductive material disposed contiguous to said semiconductor layer to collect electrons provided from said semiconductor layer, a nonblocking potential barrier being formed between the collecting layer and the semiconductive layer and a blocking potential barrier being formed between the contact layer and the semiconductive layer, first biasing means operatively connected across said insulating layer to form a tunnel barrier at said metal insulator interface, said tunnel barrier being adjusted by said biasing means so that radiations of predetermined wavelengths may be sensed by said photocell, and second biasing means operatively connected across said semiconductive layer to accelerate electrons penetrating said contact layer over said potential barrier through said semiconductive layer to be collected by said collecting layer.

5. A thin film photocell having current gain and operative with incident radiations comprising, a first layer comprising an electrically conductive material having a resistance greater than zero to receive radiations said first layer having a thickness such that substantially all radiations received by said first layer are absorbed thereby and thin enough that a substantial number of photo excited electrons pass through said first layer, a second layer comprising an insulating material disposed contiguous to said first layer to form a metal insulator interface therebetween, said insulating layer being thin enough to permit tunneling therethrough, a third layer comprising an electrically conducting material having a resistance greater than zero disposed contiguous to said second layer and being thin enough to permit an appreciable fraction of the electrons incident thereon to pass therethrough, a fourth layer comprising a semiconductive material disposed contiguous to said third layer, said fourth layer having controlled electron trapping levels, a fifth layer comprising an electrically conductive material disposed contiguous to said fourth layer for collecting electrons presented thereto, said fourth layer operative to trap electrons penetrating therein from said third layer with a hole being injected into said fourth layer from said fifth electrode for each electron trapped and thereby providing current gain within said photocell, and biasing means operatively connected across said second and fourth layers to form a tunneling barrier at said metal insulator interface, said tunnel barrier being adjusted so that radiations of predetermined wavelengths may be sensed by said photocell.

6. A thin film photocell having current gain and operative with incident radiations comprising, an emitting layer comprising an electrically conductive material having a resistance greater than zero to receive radiations, said emitting layer having a thickness such that substantially all radiations received are absorbed thereby and being thin enough that a substantial number of photo excited electrons pass therethrough, an insulating layer disposed contiguous to said emitting layer to form a metal insulator interface therebetween, said insulating layer being thin enough to permit tunneling of photo excited electrons from said emitting layer therethrough, a contact layer disposed contiguous to said insulating layer and being thin enough to permit an appreciable fraction of the electrons incident thereon to pass therethrough, a semiconductive layer disposed contiguous to said contact layer, said semiconductor layer having controlled trapping levels, a collecting layer comprising an electrically conductive material having a resistance greater than zero disposed contiguous to said semiconductive layer for collecting electrons applied thereto, said semiconductive layer being operative to trap electrons injected from said contact layer with a hole entering said semiconductive layer for each electron trapped from said collecting electrode and thereby providing current gain within said photocell, first biasing means operatively connected across said insulating layer to form a tunneling barrier at said metal insulator interface, said tunnel barrier being adjustable by said first biasing means so that radiations of predetermined wavelengths may be sensed by said photocell, and second biasing means operatively connected across said semiconductive layer to allow holes to be supported across said semiconductive layer from said collecting layer.

References Cited

UNITED STATES PATENTS

| | | | |
|---|---|---|---|
| 3,024,140 | 3/1962 | Schmidlin | 307—88.5 |
| 3,049,622 | 8/1962 | Ahlstrom et al. | 307—88.5 |
| 3,056,073 | 9/1962 | Mead | 317—234 |
| 3,116,427 | 12/1963 | Giaever | 317—234 |
| 3,146,138 | 8/1964 | Shirland | 317—237 |
| 3,193,685 | 7/1965 | Burstein | 250—211 |
| 3,204,159 | 8/1965 | Bramley et al. | 317—234 |

RALPH G. NILSON, *Primary Examiner.*

J. D. WALL, *Assistant Examiner.*